US009406824B2

(12) United States Patent
Hazeghi et al.

(10) Patent No.: US 9,406,824 B2
(45) Date of Patent: Aug. 2, 2016

(54) NANOPILLAR TUNNELING PHOTOVOLTAIC CELL

(71) Applicant: QuSwami, Inc., San Francisco, CA (US)

(72) Inventors: Arash Hazeghi, San Francisco, CA (US); Patrick M. Smith, San Jose, CA (US)

(73) Assignee: QUSWAMI, INC., San Francisco, CA (US)

( * ) Notice: Subject to any disclaimer, the term of this patent is extended or adjusted under 35 U.S.C. 154(b) by 507 days.

(21) Appl. No.: 13/679,833

(22) Filed: Nov. 16, 2012

(65) Prior Publication Data

US 2013/0125965 A1    May 23, 2013

Related U.S. Application Data

(60) Provisional application No. 61/563,453, filed on Nov. 23, 2011.

(51) Int. Cl.
*H01L 31/0352* (2006.01)
*H01L 31/18* (2006.01)
*H01L 31/062* (2012.01)

(52) U.S. Cl.
CPC ...... *H01L 31/035281* (2013.01); *H01L 31/062* (2013.01); *H01L 31/18* (2013.01); *Y02E 10/50* (2013.01)

(58) Field of Classification Search
CPC .............. H01L 31/035281; H01L 31/062
See application file for complete search history.

(56) References Cited

U.S. PATENT DOCUMENTS

| 4,117,506 | A | 9/1978 | Carlson et al. |
| 4,403,239 | A | 9/1983 | Yamazaki |
| 5,211,761 | A | 5/1993 | Noguchi et al. |
| 8,344,241 | B1 * | 1/2013 | Vidu ...................... B82Y 10/00 136/244 |
| 2001/0013362 | A1 * | 8/2001 | Kondo ............ H01L 31/022466 136/265 |
| 2002/0011263 | A1 | 1/2002 | Muramoto |
| 2002/0192441 | A1 * | 12/2002 | Kalkan ............... H01L 51/4213 428/209 |
| 2004/0084080 | A1 * | 5/2004 | Sager .................. H01L 51/4226 136/263 |
| 2004/0109666 | A1 * | 6/2004 | Kim, II .................... F24J 2/067 385/147 |

(Continued)

OTHER PUBLICATIONS

Vladimir Smirnov, et al.; Microcrystalline silicon n—i—p solar cells prepared with microcrystalline silicon oxide (uc-SiOx:H) n-layer; Phys. Status Soldi C7 No. 3-4; pp. 1053-1056; published on-line Feb. 12, 2015.

(Continued)

*Primary Examiner* — Golam Mowla
(74) *Attorney, Agent, or Firm* — Kaye Scholer LLP

(57) ABSTRACT

The present disclosure relates to a nanopillar tunneling photovoltaic ("NPTPV"), and method for fabricating it. The NPTPV device has a regular array of semiconductor pillar cores formed on a substrate having a conductive surface. Layers of high-k material are formed on the cores to provide an efficient tunneling layer for electrons (or holes) generated by incident photons in the cores. Transparent conductive collector layers are formed on the tunneling layer to collect the tunneled carriers. An optimized deposition process, various surface preparations, an interfacial layer between the pillars and the high-k tunnel layer, and optimized pre- and post-deposition annealing reduce the interface trap density and thus reduce recombination prior to tunneling. The absence of a junction also reduces core recombination, resulting in a high short-circuit current. Modifying the collector material and core doping tunes the open-circuit voltage. Such NPTPVs result in large-scale low-cost PVs.

10 Claims, 5 Drawing Sheets

(56) References Cited

U.S. PATENT DOCUMENTS

| | | | |
|---|---|---|---|
| 2005/0098205 A1* | 5/2005 | Roscheisen et al. | 136/263 |
| 2005/0121068 A1* | 6/2005 | Sager | H01L 51/4213 136/252 |
| 2006/0118166 A1* | 6/2006 | Iwaki | 136/263 |
| 2006/0207647 A1* | 9/2006 | Tsakalakos | B82Y 20/00 136/256 |
| 2009/0194152 A1 | 8/2009 | Liu et al. | |
| 2009/0283139 A1 | 11/2009 | Chen | |
| 2010/0096013 A1 | 4/2010 | Park | |
| 2010/0186802 A1 | 7/2010 | Borden | |
| 2011/0162706 A1 | 7/2011 | Borden et al. | |
| 2013/0048070 A1 | 2/2013 | Hazeghi et al. | |

OTHER PUBLICATIONS

MIS Solar Cells: A Review; David Pulfrey; IEEE Transactions on Electron Devices, vol. ED-25, No. 11, Nov. 1978, pp. 1308-1317.

18.5% Efficient First-Generation MIS Inversion-Layer Silicon Solar Cells; Axel Metz, et.al., Institut für Solarenergieforschung Hameln/Emmerthal (ISFH) Emmerthal, 1997, pp. 31-34.

On the Stability of MIS Solar Cells; J.K. Kleta and D.L. Plufrey; IEE Electron Device Letters, vol. Edl-1, No. 6, Jun. 1980, pp. 107-109.

655 mV open-circuit voltage, 17.6% efficient silicon MIS solar cells; R.B. Godfrey and M.A. Green, pp. 790-793, Jun. 1, 1979.

A 15% Efficient Silicon MIS Solar Cell; R.B. Godfrey and M.A. Green; Appl. Phys. Lett. 33(7) Oct. 1, 1978, p. 637.

Amorphous Silicon MIS Solar Cells; J.Wilson and J.McGill; Nature vol. 272, Mar. 9, 1978, pp. 152-153.

Silicon Dioxide (Si02); http://inmmc.org/ftp/material/silicon-dioxide.html; accessed and printed Apr. 8, 2015; pp. 1-2.

Silicon Nitride (Si3N4); http://inmmc.org/ftp/material/silicon-nitride.html; accessed and printed Apr. 8, 2015; pp. 1.

Semiconductor Glossary; Semiconductor OneSource; http://www.semi1source.com/glossary/default.asp?searchterm=high-k+dielectric; accessed and printed Apr. 9, 2015; pp. 1.

* cited by examiner

NANOPILLAR TUNNELING PHOTOVOLTAIC CELL

CROSS-REFERENCE TO RELATED APPLICATION

This application claims the benefit of Provisional Application No. 61/563,453, filed Nov. 23, 2011. Priority to this provisional application is expressly claimed, and the disclosure of the provisional application is hereby incorporated herein by reference in its entirety.

FIELD

The present patent document relates generally to photovoltaic cells. In particular, the present patent document relates to a nanopillar tunneling photovoltaic device and a method of manufacturing the same.

BACKGROUND

Photovoltaic cells ("PVs") are semiconductor devices that generate power by turning photons into charge carriers and electric current that can be harvested. Given the virtually unlimited source of solar energy, PVs are the most promising devices to generate truly clean and low-cost electricity with almost zero carbon emissions. To generate electricity from light, photons can be absorbed by a semiconductor material in a planar p-n junction device. An incident photon generates an electron-hole pair ("EHP") in the conduction and the valance band of the semiconductor. The EHP is then separated by an electric field formed in a p-n junction. The electron is collected at one electrode and the hole is collected at another electrode, giving rise to an electric current in an external circuit connected to the electrodes, which can drive a load.

Adoption of solar technology for power generation has been very slow, however, due to cost and efficiency issues with current PVs. The majority of today's commercial solar panels for residential, industrial, or portable application are manufactured using single-crystal silicon ("Si") wafers. State-of-the-art Si cells have a typical efficiency of about 18% to 20%. The solar power density is about 1 kW/m$^2$ (AM1.5), requiring large panels to generate a modest power output. Given the cost of high purity (low defect density) Si material required for single-crystal cells, the overall high system cost prohibits it from being economically attractive to an average household or industry, even with current government incentives and subsidies. Either a significant increase in efficiency, a significant decrease in cost, or some degree of both at the same time, is needed in order to make solar technology truly competitive for power generation.

Solar cell efficiency is limited by two factors: Si intrinsic absorption and charge collection efficiency. First, the most common light absorbing material, Si, has a bandgap of 1.12 eV at room temperature. This bandgap makes it difficult to capture the long wavelength portion of the solar spectra associated with infrared light, which contains about 25% to 30% of the total solar incident energy. Furthermore, Si is an indirect bandgap material. The indirect bandgap reduces the absorption coefficient, $\alpha$, such that relatively thick layers are needed to effectively absorb light. Usually, about 100 µm or thicker Si is needed. But, thicker Si translates directly into higher starting material cost and thus higher overall manufacturing cost. Shorter wavelength photons that have energies higher than the Si bandgap will lose their additional energy to heat (phonons) upon absorption. About 20% to 30% of the absorbed energy turns into heat, which is wasted. Today's solar cells use sophisticated light-trapping techniques to avoid light reflection from the surface of the cell. Such light-trapping techniques include surface texturing, antireflective ("AR") coatings, and encapsulation in glass. Despite these techniques, about 10% of the incident light will still be reflected by the PV device and lost. As a result, about 60% of the energy is lost by the time the photons have been converted to EHPs.

Second, solar cell efficiency is limited by the charge collection efficiency. EHPs that are generated by light may nonetheless be lost during transport to electrodes. Some EHPs recombine along the way to the electrodes, turning useful energy into heat. Internal quantum efficiency ("$\eta_{int}$") is a measure of efficiency in the charge collection process, which for state-of-the-art Si cells is about 90%.

These two factors, together with other non-idealities such as loss at the interfaces and area overhead in packaging, reduce the net system conversion efficiency to about 22% for the best single-crystal Si planar cells. Increasingly, obtaining increased efficiency by further optimization with Si is difficult and the gains are insignificant. Alternatively, utilizing other structures such as multi junction cells or alternative materials such as group III-V or II-VI semiconductors significantly increases cost and complexity of the PV. For example, multi-junction and gallium arsenide ("GaAs") solar cells with efficiencies above 40% have been fabricated by several companies and are used for space and military applications. However, the high cost of these devices prohibits commercial use. It is clear that optimization of current planar Si PV technology alone cannot offer significant increase in efficiency or reduction in cost.

Another alternative technology that has emerged in the past few years is nanowire ("NW") solar cells. A NW is a high aspect ratio wire with a diameter ranging from about tens of nanometers to several microns. NWs can be made tens of microns long. NWs can be synthesized, in single-crystal from, on a variety of low-cost substrates such as stainless steel, glass coated with indium tin oxide ("ITO"), or aluminum foil, using a low-cost chemical vapor deposition ("CVD") or similar vapor-liquid-solid ("VLS") processes. A significant amount of Si volume is saved by using an array of nanowires or similar high aspect ratio structures with gaps between them as opposed to a solid planar Si wafer. This approach lowers material costs significantly.

Although the total absorption volume is smaller compared to planar cells, NWs have been shown to have enhanced absorption. The absorption enhancement in the NW arrays is due to highly efficient light trapping. This light trapping has been shown to be more effective than texturing of a planar Si surface. See Garnett, E. and P. Yang, *Light Trapping in Silicon Nanowire Solar Cells,* 10 Nano Lett. 1082-87 (2010), which is fully incorporated herein by reference. Plus, there are enhancement effects stemming from the photonic crystal nature of the NW array. Plasmonic effects can also be used in order to guide and localize the field in the array and increase absorption coefficient $\alpha$, thereby permitting a considerable reduction in the physical thickness of the absorber layer. Additionally, quantum confinement can be used in narrower wires to tune the bandgap for better absorption. NWs can also be decorated with quantum dots ("QD") to further improve the spectral response. Given these advantages NW structures can compensate for the loss of volume compared to bulk planar structures and can reach total absorption figures comparable to those of the planar cells. See Garnett, E. C. et al, *Nanowire Solar Cells,* 41 Ann. Rev. Materials Res. 269-95 (2011), which is fully incorporated herein by reference.

NWs can also improve internal quantum efficiency. In traditional planar PV cells, the optical absorption path is parallel to the carrier transport path, putting absorption requirements at odds with the minority carrier diffusion length, $L_D$. A thick layer of Si is needed for effective absorption, but most EHPs will recombine after traveling a diffusion length, $L_D$, away from the junction before they are collected by the electrodes. The diffusion length, $L_D$, depends on the doping level and purity level of the crystal and is typically several tens of microns for a high-purity and low-doped Si wafer. This is why most cells use a p-i-n junction, where an intrinsic region in between the p-region and n-region increases $L_D$. Nevertheless, since $L_D$ is usually smaller than the cell thickness, some energy is lost to recombination in the depletion region, even with stringent cleaning protocols and low defect densities in manufacturing. In NW structures, the p-n or p-i-n junction can be fabricated in the radial direction, perpendicular to the NW axis along which incident light is absorbed. This will decouple the absorption and transport lengths. Carriers now only need to travel a distance equal to the NW radius to be collected and recombination is effectively eliminated. This type of structure can increase the internal quantum efficiency to close to 100%, which relaxes the purity/contamination requirements compared to planar PV cells because $L_D$ only has to exceed the NW radius. This reduces the cost. Another advantage of NW array structures is the relaxation of strain during growth, making it easier to fabricate hetero-structures and multi junction cells with materials other than Si on low cost substrates because the substrate does not need to be lattice-matched to the NW material. This makes it possible to lower the cost for non-Si based PV cells as well.

NW structures have shown great promise as low-cost PVs with overall efficiencies close to that of the state-of-the-art planar cells, and with possible quantum mechanical "boosters" to further improve absorption, paving a path for future scaling. However, great challenges have limited manufacturability and practical efficiencies of NW arrays. In particular, the NW PV needs to operate in radial junction mode to offer a reasonable efficiency. Forming a radial junction in a NW by post-growth doping is extremely difficult due to the small dimensions of the wire. The most common way to fabricate a p-n or p-i-n junction in a NW is to etch a p-doped or n-doped Si substrate and deposit a shell around the core, which is doped with the opposite-type impurity, either n- or p- respectively, during deposition. Deposition is usually a CVD process. In such a method the shell may not be fully crystallized, yielding many vacancy/dislocation defects. In addition, the interface between the shell/core or shell/i-region is often poor, causing massive recombination due to a high density of interface defects ($D_{it}$). The resulting PV cell has high leakage and recombination, resulting in a low open circuit voltage ("$V_{OC}$") and a poor fill factor ("FF"). For example, a $V_{OC}$=0.5 V and FF=60% is among the best data published. The difficulties in controlling the radial junction and doping profile only become worse as the NW diameter is scaled down to take advantage of plasmonic and quantum effects. When the diameter of the NW is reduced to about 200 nm it may not be possible to create a junction at all, since the NW will become fully-depleted.

In order to compete with single-crystal planar PV cells, a radial p-n or p-i-n junction needs be created in each NW pillar which is very difficult to achieve and control and may be completely impractical in ultra-thin pillars. The proposed methods so far rely on etching doped Si to create the core of the pillar and a shell which is doped with the opposite type impurity during deposition by techniques such as CVD. This method leads to poor quality junctions with significant surface and interface recombination. The NW cells that have been fabricated in this fashion have had poor efficiencies so far making them unattractive for commercial applications.

SUMMARY

In an embodiment a photovoltaic device is disclosed. The photovoltaic device comprises a first electrode; a second electrode; and a plurality of pillars formed on the first electrode layer, each pillar comprising a pillar core formed of a semiconductor material and having a base, a top, a side, and a central axis, wherein the pillar core is electrically connected to the first electrode at the base; a tunneling layer formed of a high-k dielectric material on the top and the side of the pillar core; and a collector layer formed of a conducting material on the tunneling layer and electrically connected to the second electrode.

According to another embodiment each pillar further comprises an interfacial layer between the pillar core and the tunneling layer.

According to another embodiment each pillar further comprises a capping layer formed on the collector layer.

According to another embodiment the photovoltaic device further comprises a flexible substrate underpinning the second electrode; and a flexible filler material filling a volume between the plurality of pillars.

According to another embodiment each pillar of the plurality of pillars has the shape of a circular cylinder.

According to another embodiment each pillar of the plurality of pillars has a diameter at a half maximum of between ten nanometers and ten micrometers.

According to another embodiment the tunneling layer is between twenty angstroms and thirty angstroms thick measured at a side of each pillar of the plurality of pillars.

According to another embodiment the high-k dielectric material comprises hafnium oxide.

According to another embodiment the semiconductor material comprises silicon.

According to another embodiment the semiconductor material comprises p-type doped silicon.

According to another embodiment the semiconductor material comprises n-type doped silicon.

According to another embodiment the central axis of each pillar of the plurality of pillars intersects the first electrode at a point, the plurality of points forming a plurality of vertices of a square grid.

In an embodiment a method of fabricating a tunneling photovoltaic is disclosed. The method comprises providing a substrate having a patterned surface; and forming a plurality of pillar cores of a semiconductor material on the patterned surface, the plurality of pillar cores a base for a plurality of pillars, and each pillar core of the plurality of pillar cores having a top and a side; forming a tunneling layer of high-k dielectric material on the top and the side of each pillar core; and forming a collector layer on the tunneling layer.

According to another embodiment the method further comprises forming an interfacial layer, wherein the interfacial layer is between the pillar core and the tunneling layer.

According to another embodiment the method further comprises forming a capping layer on the collector layer.

According to another embodiment the substrate is flexible, and the method further comprising filling a volume between the plurality of pillars after forming the collector layer.

According to another embodiment each pillar of the plurality of pillars has substantially the shape of a circular cylinder.

According to another embodiment each pillar of the plurality of pillars has a diameter at a half maximum of between ten nanometers and ten micrometers.

According to another embodiment the tunneling layer is between twenty angstroms and thirty angstroms thick measured at a side of each pillar of the plurality of pillars.

According to another embodiment the high-k dielectric material comprises hafnium oxide.

According to another embodiment the semiconductor material comprises silicon.

According to another embodiment the semiconductor material comprises p-type doped silicon.

According to another embodiment the semiconductor material comprises n-type doped silicon.

According to another embodiment the central axis of each pillar of the plurality of pillars intersects the substrate at a point, the plurality of points forming a plurality of vertices of a square grid.

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and, together with the general description given above and the detailed description of the preferred embodiments given below, serve to explain and teach the principles described herein.

Figure 1:
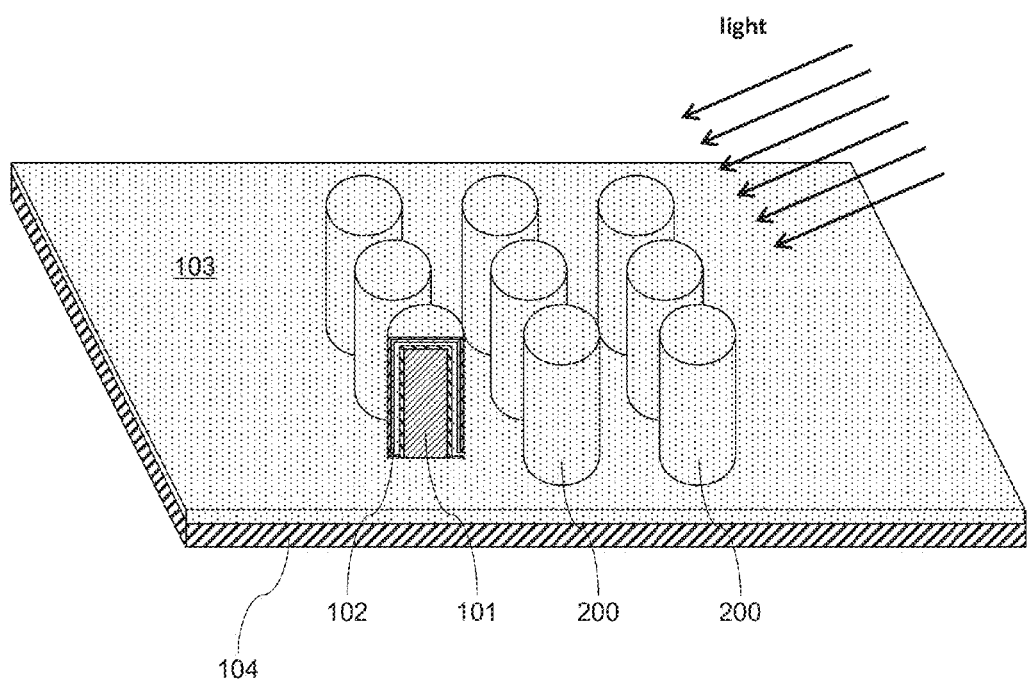
FIG. 1 illustrates an nanopillar tunneling photovoltaic ("NPTPV") cell array structure.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A nanopillar tunneling photovoltaic ("NPTPV") apparatus is disclosed, as well as a method of manufacturing a NPTPV. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

The various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Various described embodiments make use of a tunneling barrier stack to split and extract charge carriers. A nanopillar ("NP") array structure is formed with a tunneling shell. The NPTPV array includes a nanopillar core with a diameter of several microns to tens of nanometers incorporated in a tunneling stack. A NP will be encapsulated by a tunneling barrier stack to allow efficient quantum-mechanical tunneling of carriers, such as high-k dielectrics, that exhibit a low conduction-band offset, $\Phi_b$, to the semiconductor material in the NP and/or a low tunneling effective mass, m*, for example less than 0.4 $m_0$. An interfacial layer ("IL") between the core and the high-k dielectric passivates the NP surface reducing the interface trap density, $D_{it}$, and the surface recombination, therefore increasing energy conversion efficiency.

There is no junction or doping profile control that limits the scalability or manufacturability of the NP arrays. But, the NP needs to have uniform doping which is achieved during growth. Optically-generated minority carriers tunnel out of the NP to the collector shell, while majority carriers are collected directly from the core of the NP that is in contact with a conductive substrate or a contact mesh. The average transport length to the tunnel barrier is equal to the NP radius, relaxing the stringent minority carrier diffusion length requirements. This eases the cleanliness/defect density requirement, further reducing manufacturing cost.

The surface of the NP can be passivated by the dielectric stack, reducing surface recombination and increasing efficiency. By using a low-band-offset tunnel barrier, the short circuit current ("$I_{SC}$"), will be limited by absorption in the NP array only, and not by tunneling, while the physical thickness of the barrier of 20 Å to 30 Å is feasible for large-scale manufacturing. The $V_{OC}$ can be tuned by NP doping and by tuning the collector work function. The use of a collector with appropriate work function will ensure a high $V_{oc}$ and FF. The collector can be any material with an appropriate work function that forms a transparent shell on the NP.

FIG. 1 is an illustration of an NPTPV array cell structure, according to an embodiment. Each nanopillar 200 of the array is formed on a substrate that may be rigid or flexible. Each nanopillar include a nanopillar core 101 together with a tunneling barrier stack 102, which are shown in FIG. 1 in a cross-section of one nanopillar 200. The tunneling barrier stack 102 is a shell of high-k dielectric covering nanopillar core 101, thinner than about 40 Å. Nanopillar core 101 of each nanopillar is electrically connected to a bottom electrode 103. A collector of the tunneling barrier stack is connected to a top transparent conductive electrode layer that is not illustrated. In another embodiment, a transparent conductive filler material fills the volume between the nanopillars 200, connecting their top electrodes, either replacing the top transparent conductive electrode layer or in addition to the top transparent conductive electrode layer.

Nine such nanopillars 200 are shown in FIG. 1, but it is understood that a full NPTPV device will have many such nanopillars. The nine nanopillars 200 are arranged regularly at the vertices of a square grid in FIG. 1. However, the nanopillars 200 can be arranged at the vertices of a hexagonal grid, a triangular grid, or an offset square grid, can be arranged irregularly, or can be arranged in any other desired arrangement or pattern. Nanopillars 200 can also have a diameter of several tens of nanometers to several microns. A circular cylindrical nanopillar is illustrated. However, in another embodiment nanopillars 200 can have polygonal cross-sections or other cylindrical-like shapes that are non-circular.

Figure 2:
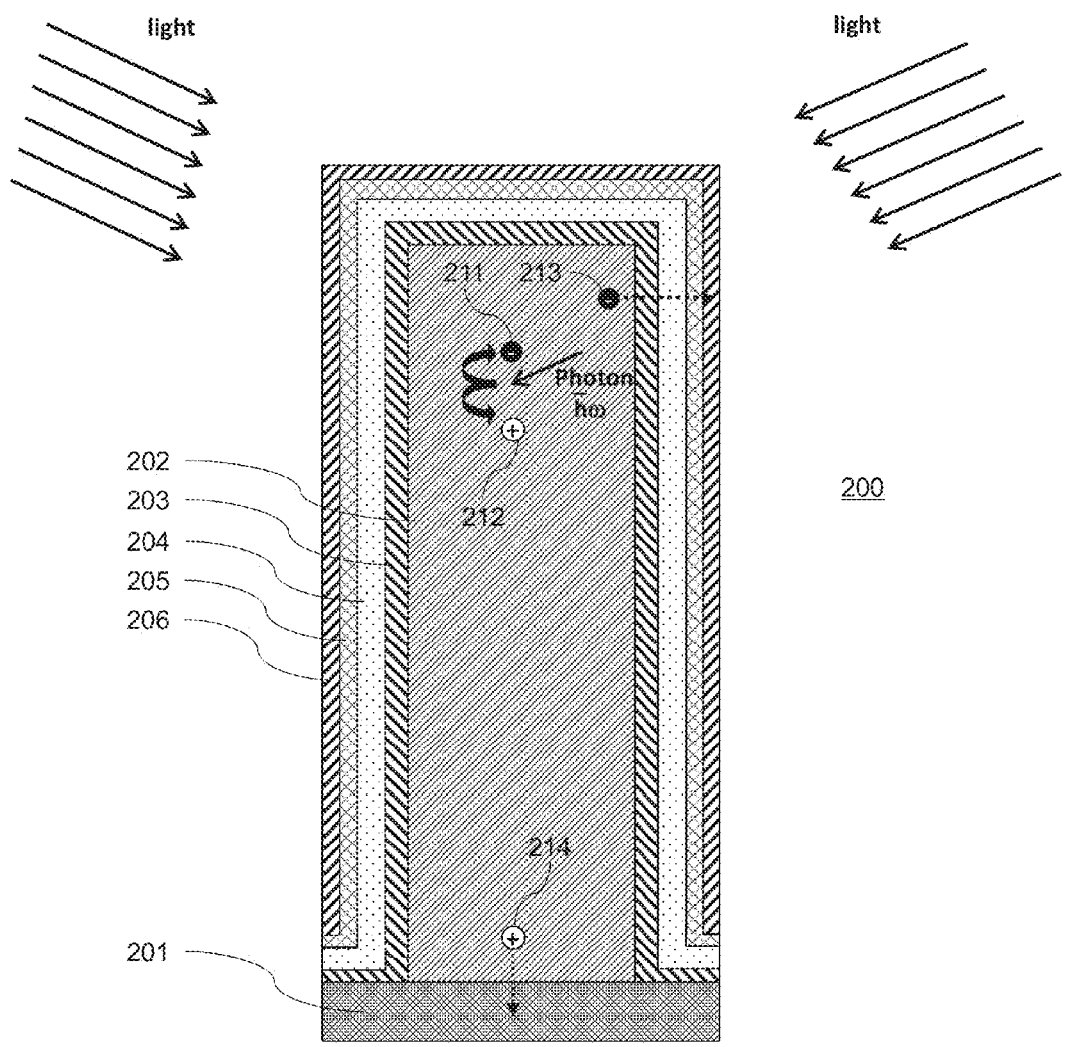
FIG. 2 illustrates a cross-section of a nanopillar of a NPTPV cell having a tunneling barrier stack.

FIG. 2 is an illustration of the cross-section of a nanopillar 200 of the NPTPV array cell structure, according to an embodiment. Nanopillar core 202 is a high-aspect ratio structure made from single crystal or poly-crystal silicon formed on a bottom electrode 201. Nanopillar core 202 can also be made from other materials with bandgaps that enhance light absorption, including amorphous silicon, Group III-V or II-VI compound semiconductors such as gallium arsenide (GaAs), gallium nitride (GaN), indium arsenide (InAs), indium gallium arsenide (InGaAs), aluminum gallium arsenide (AlGaAs), indium phosphide (InP), cadmium sulfide (CdS), cadmium selenide (CdSe), or cadmium telluride (CdTe), or metal oxides such as zinc oxide (ZnO) or titanium oxide ($TiO_2$).

Here, nanopillar 200 is p-type. Incident photons generate electron-hole pairs, each consisting of an electron 211 and a hole 212. The electrons and holes drift toward the tunneling barrier stack and bottom electrode respectively. Electrons 213 at the side of nanopillar core 202 tunnel through the tunneling barrier stack to be collected at an electrode. Electrons 213 also tunnel through at the top of the nanopillar core 202. Holes 214 are collected at the bottom electrode 201, which is an Ohmic contact to the nanopillar core 202.

According to another embodiment, nanopillar 200 is n-type such that the minority carriers are holes that will tunnel out while electron majority carriers will be extracted by the bottom electrode 201 contact to the nanopillar core 202.

The tunneling barrier stack 102 includes a tunnel barrier layer 204 made from a high-k dielectric. High-k dielectrics can be metal oxides with a large bandgap and a high dielectric constant. High-k materials have a smaller conduction band offset, $\Phi_b$, to the conduction band of Si and other semiconductors and thus allow high levels of tunnel current with a larger physical thickness compared to silicon dioxide ($SiO_2$). Therefore they do not need to be scaled as aggressively to provide a high tunnel current. In addition to lower barrier, high-k materials have a lower tunneling effective mass compared to $SiO_2$, which makes tunneling more efficient for a given physical thickness. For example, the tunneling effective masses of hafnium oxide is approximately 0.2 ($m_{eff} \sim 0.2 m_o$), while the tunneling effective mass of silicon dioxide is approximately 0.4 ($m_{eff} \sim 0.4 m_o$). This will further boost the tunnel current ensuring that optically-generated electrons (for a p-type nanopillar 200) or holes (for a n-type nanopillar 200) will exit the nanopillar core 202 via tunneling. In an embodiment, the high-k dielectric is hafnium oxide ($HfO_2$). The tunnel layer can be about 20 Å to 30 Å in thickness. According to other embodiments, tunnel barrier layer 204 can be other suitable high-k dielectrics including titanium dioxide ($TiO_2$), aluminum oxide ($Al_2O_3$), Lanthanum oxide ($La_2O_3$), zirconium oxide ($ZrO_2$), tantalum oxide ($Ta_2O_5$), nitrided hafnium silicates (HfSiON), silicates such as Zirconium Silicate ($ZrSiO_4$), or other compounds with similar properties.

Interfacial layer 203 can be deposited between the nanopillar core 202 and the tunnel barrier layer 204. The IL passivates the nanopillar core 202 and reduces the interface trap density, $D_{it}$, at the interface between nanopillar core 202 and tunnel barrier layer 204, thus reducing the number of generated carriers that are lost to surface recombination prior to tunneling. Since there is no junction, recombination in the nanopillar core 202 is also reduced. With these reductions in recombination, a high $I_{SC}$ can be achieved. Interfacial layer 203 can be made with an optimized deposition process such as atomic layer deposition ("ALD") accompanied by various surface preparations as well as optimized pre- and post-deposition annealing. The interfacial layer can be made of silicon oxide ($SiO_x$), silicon nitride ($Si_xN_y$), other nitride, oxynitride, chemical oxide or similar compounds.

Collector layer 205 is a layer of material with high electrical conductivity and appropriate work function, and is also transparent. The work function of the collector layer 205 should be such that a large electric field exists across the tunneling barrier layer 204, allowing direct tunneling of carriers from the nanopillar core 202 to the collector 205. For a p-type nanopillar core, the work function of the collector layer 205 should be low. For a n-type nanopillar core, the work function should be high. Such materials include nitrides such as titanium nitride (TiN), silicides such as titanium silicide ($TiSi_2$), doped polysilicon, transparent conductive oxides ("TCOs") such as indium tin oxide (ITO) or titanium dioxide ($TiO_2$), or similar materials. By selecting a collector with an appropriate work function, and tuning the doping level of nanopillar core 202 during growth $V_{OC}$ can be tuned to values that are comparable to planar cells.

A top capping layer 206 may be deposited to further encapsulate the collector. This capping layer may help tune the work function of the stack by inducing charges (dipoles) at the interface of the tunneling barrier layer 204 and the interfacial layer 203, or the interface of the interfacial layer 203 and the nanopillar core 202. Top capping layer 206 can use the same material as collector layer 205, or it may be another conductive transparent material used to tune the work function of the stack. Top capping layer 206 can be formed from any number of TCOs, including tantalum nitride (TaN) or a lanthanum nitride (LaN) or similar materials.

The area between nanopillars 200 in a nanopillar array can be filled a transparent filler material. The filler material should be transparent with a refractive index that will enhance the light-trapping properties of the nanopillar array. The filling material can further boost the light-trapping properties of the nanopillar array and improve absorption and/or act as an antireflective coating. It can also be conductive to provide an additional electrical pathway between the nanopillars, thereby reducing series resistance. This material can be the same as the material of collector layer 205 or another conductive transparent material, such as a TCO, conductive polymers, or even a liquid electrode. The filler material can be solid or liquid, organic or inorganic. In the case of a flexible nanopillar array a liquid or a polymer filler/electrode material may be used.

Figure 3:
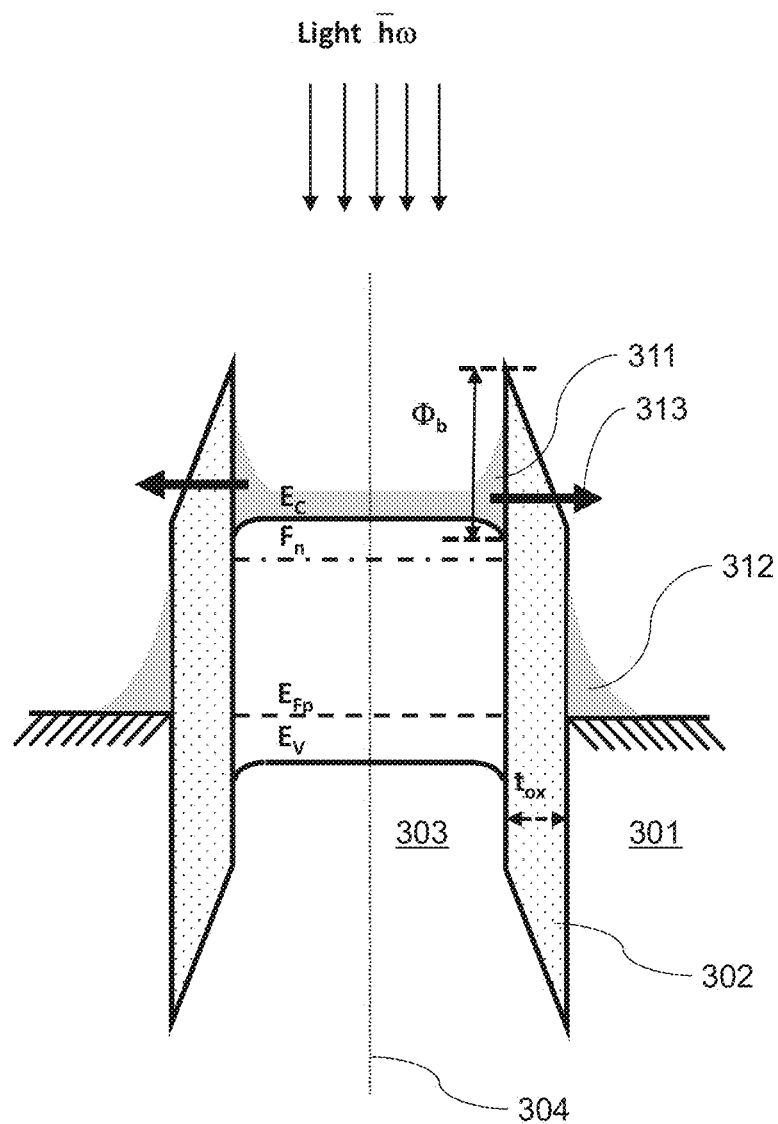
FIG. 3 illustrates an energy band diagram for a NPTPV cell in a radial direction in a short-circuit configuration with incident light.

FIG. 3 illustrates an energy band diagram for a NPTPV cell in the radial (normal to axis 304) direction with incident light, when the NPTPV cell is biased at zero volts (short circuit configuration), according to an embodiment. Incident light has split the electron and hole quasi-Fermi levels, $F_n$ and $E_{Fp}$ respectively. $E_C$ and $E_V$ are the energy levels of the conduction band and the valence band, respectively, of the nanopillar core 303. The generated electrons tunnel from the nanopillar core 303 through the tunneling barrier layer 302 having thickness $t_{ox}$ to the collector layer 301, giving their energy to the external circuit. The direction of tunneling of the electrons is illustrated conceptually with arrow 313. The work function of the collector layer 301 sets the electric field in the nanopillar. The electric field is radially symmetric with respect to axis 304 of the pillar and draws the minority carriers towards the shell where they are extracted by tunneling. Distribution 311 represents the distribution of optical electrons on the nanopillar core 303 side of tunneling layer 302. Distribution 312 represents the distribution of electrons on the collector 301 side of tunneling layer 302. The small energy band offset, $\Phi_b$, between the semiconductor and the high-k tunnel barrier layer 302, allows a sustained high tunnel current while allowing a tunnel barrier thickness in a reasonable range of about 20 Å to 30 Å for manufacturing.

Figure 4:
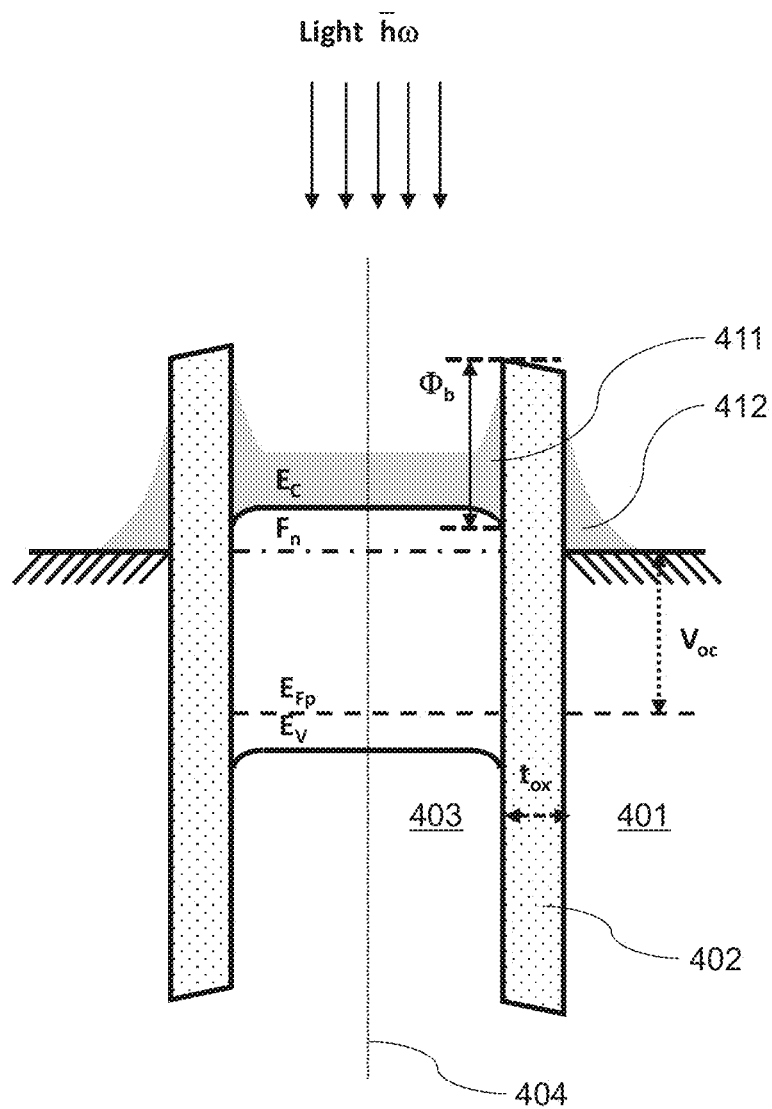
FIG. 4 illustrates an energy band diagram for a NPTPV cell in a radial direction in a open-circuit configuration with incident light.

FIG. 4 illustrates an energy band diagram for the NPTPV cell in the radial (normal to axis 404) direction with incident light when the cell is electrically open (open circuit configuration), according to an embodiment. Light has split the electron and hole quasi-Fermi levels ($F_n$ and $E_{Fp}$). Since the net current must be zero, the Fermi level of collector 401 has been raised to match $F_n$. The electric field across the tunneling barrier layer 402 having thickness $t_{ox}$ is small, and radially symmetrical with respect to axis 404. Distribution 411 represents the distribution of optical electrons on the nanopillar core 403 side of tunneling layer 402. Distribution 412 represents the distribution of electrons on the collector 401 side of tunneling layer 402. The flux of electrons from collector 401 into nanopillar core 403 is equal to the flux of electrons from nanopillar core 403 to collector 401, thus no net current is illustrated. $V_{OC}$ can be tuned by changing the nanopillar core doping and/or the work function of the collector.

Figure 5:
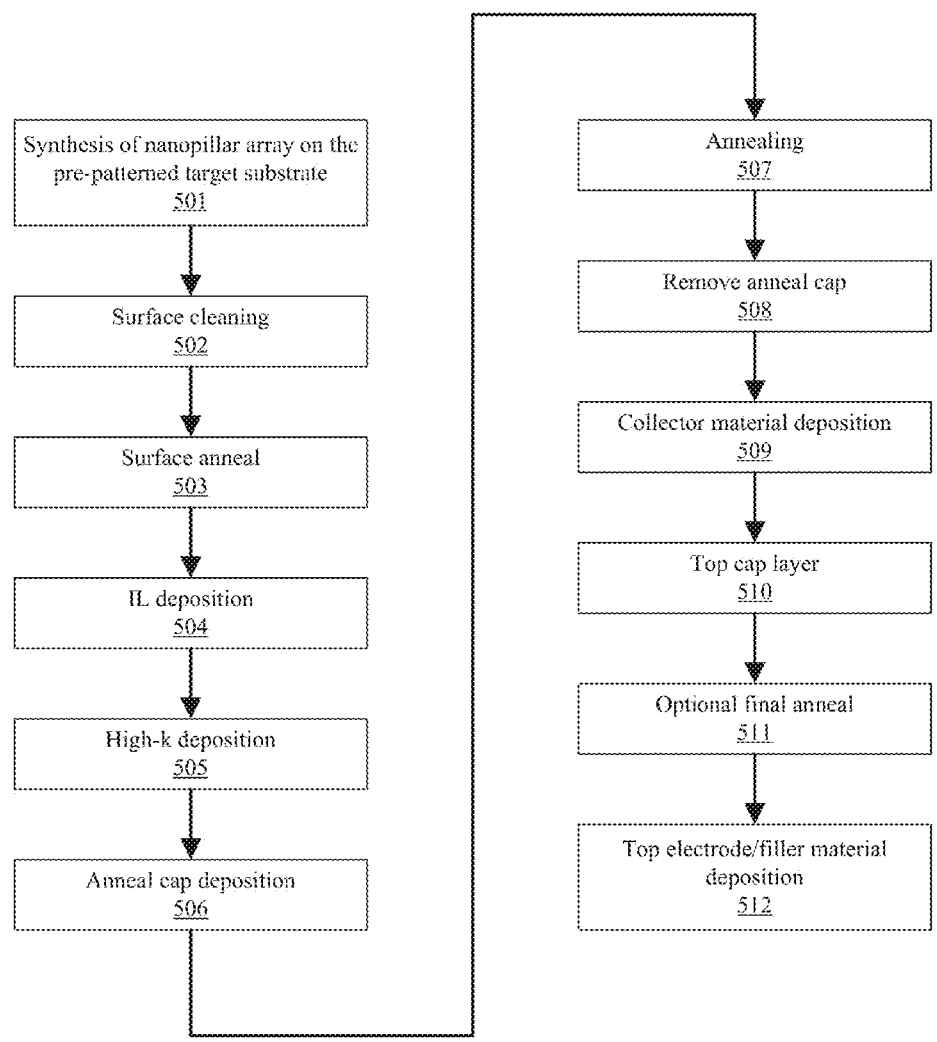
FIG. 5 illustrates key process steps of an exemplary flow to fabricate a NPTPV cell.

FIG. 5 is an illustration of a flow for manufacturing an NPTPV cell according to an embodiment. First, at step 501 a single-crystalline, poly-crystalline or amorphous semiconductor nanopillar array with the appropriate doping level is synthesized on a pre-patterned grid on a rigid or flexible substrate. The grid can be patterned by standard lithography or by block copolymer lithography, which is a low cost method for producing periodic arrays with nanometer feature size and spacing. The nanopillars are grown using a seed or catalyst such as gold particles in a VLS process, such processes including CVD or similar methods. The length and the diameter of the nanopillars are controlled by catalyst diameter, in lithography, and growth parameters. After the nanopillar array has been created, the surface of the array is cleaned and prepared for high-k stack formation at step 502. This can include chemical cleans, plasma clean, and/or passivation steps. Step 503 is an optional step, where the nanopillar array is annealed after cleaning prior to deposition of further layers. At step 504 an IL is formed by an ALD, CVD, thermal or chemical process. The purpose of the IL is to passivate the circumference of the nanopillars and reduce the interface trap/defect density, $D_{it}$. At step 505, a high-k tunneling layer is deposited using conventional ALD or CVD processes. The physical thickness of the tunnel layer may be about 20 Å to 30 Å, which is straightforward to achieve with these processes. The stack is then annealed at step 507 to further restructure the surface and the broken bonds, reducing charge/trap densities in the oxide as well as at the interfaces. The tunneling stack may optionally be capped at step 506, prior to annealing at step 507, with a polysilicon, nitride, or similar layer to prevent diffusion of some elements during annealing step 507. Without such a cap, oxygen diffusion will create vacancies in the structure and degrade $D_{it}$. This cap layer is removed at step 508, after annealing. At step 509, a collector shell with an appropriate work function is then deposited on the tunnel layer stack using methods such as ALD, CVD, physical vapor deposition ("PVD") or similar processes. A top capping layer may be deposited at step 510 to further encapsulate the collector. Step 511 is an optional step, where the device is further annealed prior to fill and packaging. Finally, at step 512, the empty gaps between the nanopillars may be filled with a transparent filler material. The nanopillar array cell is then packaged further depending on the intended application using standard PV packaging techniques.

The disclosed embodiments present numerous advantages. The embodiments make it possible to manufacture low-cost solar cells by incorporating a tunneling barrier stack into high aspect ratio structures, either with circular or polygonal cross-sections, referred to as nanopillars. The disclosed embodiments are scalable even to ultra-thin pillars. The efficiencies of the large-scale low-cost nanopillar arrays are close to that of the best planar PV structures made from the same materials. Nanopillar arrays may even exceed state-of-the-art planar cell. The manufacturing cost is noticeably lower due to savings in the volume of required material and/or relaxed cleanliness and critical defect density requirements. The NP array can also be synthesized on a variety of low-cost substrates, making it attractive for applications where a flexible substrate is desirable. Using a radial tunneling layer rather than radial junction as found in nanowires leads to higher quality junctions with reduced surface and interface recombination. The disclosed embodiments eliminate junction recombination and reduce surface recombination by passivating the surface during barrier stack formation. They also allow effective collection of charges via quantum mechanical tunneling and therefore result in a high $I_{so}$. The $V_{OC}$ is controlled by pillar doping as well as the collector work function, and can reach that of the comparable planar cells.

Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A photovoltaic device, comprising:
   a first electrode;
   a second electrode; and
   a plurality of individual pillars formed on and electrically connected to the first electrode layer, each of the plurality of individual pillars comprising:
   a discrete pillar core formed of a semiconductor material, the discrete pillar core being physically separate from every other discrete pillar core of the plurality of individual pillars, the discrete pillar core having a base, a top, a side, and a central axis, wherein the pillar core is electrically connected to the first electrode at the base, wherein incident photons generate electron-hole pairs;

an interfacial layer on the discrete pillar core that completely covers the top and the side of the discrete pillar core, and being in contact with the first electrode layer;

a thin tunneling layer formed of a high-k dielectric material that covers interfacial layer, wherein the high-k dielectric material comprises hafnium oxide; and a transparent collector layer formed of a conducting material on the tunneling layer and electrically connected to the second electrode.

2. The tunneling photovoltaic of claim 1, wherein each of the plurality of individual pillars further comprises a capping layer formed on the collector layer.

3. The tunneling photovoltaic of claim 1, further comprising:

a flexible substrate underpinning the second electrode; and a flexible filler material filling a volume between the plurality of individual pillars.

4. The tunneling photovoltaic of claim 1, wherein each pillar of the plurality of individual pillars has the shape of a circular cylinder.

5. The tunneling photovoltaic of claim 1, wherein each pillar of the plurality of individual pillars has a diameter at a half maximum of between ten nanometers and ten micrometers.

6. The tunneling photovoltaic of claim 1, wherein the thin tunneling layer is between twenty angstroms and thirty angstroms thick measured at a side of each pillar of the plurality of individual pillars.

7. The tunneling photovoltaic of claim 1, wherein the semiconductor material comprises silicon.

8. The tunneling photovoltaic of claim 7, wherein the semiconductor material comprises p-type doped silicon.

9. The tunneling photovoltaic of claim 7, wherein the semiconductor material comprises n-type doped silicon.

10. The tunneling photovoltaic of claim 1, wherein the central axis of each pillar of the plurality of individual pillars intersects the first electrode at a point, the plurality of points forming a plurality of vertices of a square grid.

* * * * *